United States Patent [19]

Edmond et al.

[11] Patent Number: 5,539,217
[45] Date of Patent: Jul. 23, 1996

[54] SILICON CARBIDE THYRISTOR

[75] Inventors: John A. Edmond, Apex; John W. Palmour, Cary, both of N.C.

[73] Assignee: Cree Research, Inc., Durham, N.C.

[21] Appl. No.: 103,866

[22] Filed: Aug. 9, 1993

[51] Int. Cl.$^6$ ........................ H01L 31/0312; H01L 29/74; H01L 31/111
[52] U.S. Cl. ............................ 257/77; 257/147; 257/153
[58] Field of Search .................................. 257/147, 149, 257/150, 151, 152, 148, 77, 133

[56] References Cited

U.S. PATENT DOCUMENTS

| | | | |
|---|---|---|---|
| 3,312,880 | 4/1967 | Longo et al. | 257/148 |
| 3,980,420 | 9/1976 | Baysinger et al. | 431/78 |
| 4,032,364 | 6/1977 | Anthony et al. | 257/77 |
| 4,742,382 | 5/1988 | Jaecklin | 257/149 |
| 4,769,686 | 9/1988 | Horiuchi et al. | 257/77 |
| 4,788,819 | 12/1988 | Henkel | 60/603 |
| 4,945,394 | 7/1990 | Palmour et al. | 257/77 |
| 5,093,283 | 3/1992 | Rowe | 437/229 |
| 5,202,750 | 4/1993 | Gough | 257/133 |
| 5,233,215 | 8/1993 | Boliga | 257/77 |
| 5,247,192 | 9/1993 | Nii | 257/77 |
| 5,264,713 | 11/1993 | Palmour | 257/256 |

FOREIGN PATENT DOCUMENTS

| | | |
|---|---|---|
| 63-278274 | 3/1987 | Japan . |
| 63-278276 | 5/1987 | Japan . |
| 63-278275 | 5/1987 | Japan . |
| WO93/11540 | 6/1993 | WIPO . |

OTHER PUBLICATIONS

*High Frequency 6000V Double Gate GTOs*, T. Ogura et al., International Electron Devices Meeting Dec., 1988, pp. 610–613.

*Comparison of 6H–SiC, 3C–SiC, and Si for Power Devices*, M. Bhatnager et al., IEEE Transactions on Electron Devices, vol. 40, No. 3, Mar. 1993, pp. 645–655.
*Description of a Technique for the Reduction of Thyristor Turn–Off Time*, H. B. Assalit et al.; IEEE Transactions on Electron Devices, vol. ED21, No. 7, Jul. 1974, pp. 416–420.
*Recent Developments in SiC Single–Crystal Electronics*, P. A. Ivanov et al., Semiconductor Science and Technology, No. 7, Jul. 1992, pp. 863–880.
*First SiC Dymistor*, V. A. Dimitriev et al., Electronics Letters, vol. 24, No. 16, Aug. 1988, pp. 1031–1033.
International Search Report completed Dec. 16, 1994 for International Appl. No. PCT/US 94/08990 filed May 8, 1994.
Edmond, John A., John W. Palmour, and Calvin H. Carter, Jr., "Junction Devices in 6H–SiC", 1991 International Semiconductor Device Research Symposium, Dec. 4–6, 1991.
"High–temperature electrical proportions of 3C–SiC epitaxial layers grown by CVD,"; Sasaki et al; pp. 72–73; Applied Physics letters vol. 45; 1 Jul. 1984.

*Primary Examiner*—Wael M. Fahmy
*Attorney, Agent, or Firm*—Bell, Seltzer, Park & Gibson

[57] ABSTRACT

The SiC thyristor has a substrate, an anode, a drift region, a gate, and a cathode. The substrate, the anode, the drift region, the gate, and the cathode are each preferably formed of silicon carbide. The substrate is formed of silicon carbide having one conductivity type and the anode or the cathode, depending on the embodiment, is formed adjacent the substrate and has the same conductivity type as the substrate. A drift region of silicon carbide is formed adjacent the anode or cathode and has an opposite conductivity type as the anode or cathode. A gate is formed adjacent the drift region or the cathode, also depending on the embodiment, and has an opposite conductivity type as the drift region or the cathode. An anode or cathode, again depending on the embodiment, is formed adjacent the gate or drift region and has an opposite conductivity type than the gate.

18 Claims, 3 Drawing Sheets

SILICON CARBIDE THYRISTOR

FIELD OF THE INVENTION

The National Aeronautical and Space Administration ("NASA"), under Contract No. NAS3-26594, and the Strategic Defense Initiative Office ("SDIO") (administered through the Office of Naval Research) under Contract No. 00014-90-C-0037, have at least partially supported the development of this invention. The government therefore may have certain rights in this invention. This invention relates to thyristors, and more particularly to a thyristor formed in silicon carbide.

BACKGROUND OF THE INVENTION

Generally, a thyristor is a bistable power semiconductor device that can be switched from an off-state to an on-state, or vice versa. Power semiconductor devices, such as thyristors, high-power bipolar junction transistors ("HPBJT"), or power metal oxide semiconductor field effect transistors ("MOSFET"), are semiconductor devices capable of controlling or passing large amounts of current and blocking high voltages. Thyristors are generally known and conventionally have three terminals: an anode, a cathode, and a gate. A thyristor is turned on by applying a short current pulse across the gate and the cathode. Once the thyristor turns on, the gate loses its control to turn off the device. The turn off is achieved by applying a reverse voltage across the anode and the cathode. A specially designed gate turn-off thyristor ("GTO"), however, is typically turned off by a reverse gate pulse. The GTO thyristors generally start conduction by some trigger input and then behave as diodes thereafter.

A thyristor is a highly rugged device in terms of transient currents, di/dt and dv/dt capability. The forward voltage ($V_F$) drop in conventional silicon thyristors is about 1.5 V to 2 V, and for some higher power devices, about 3 V. Therefore, the thyristor can control or pass large amounts of current and effectively block high voltages (i.e., a voltage switch). Although $V_F$ determines the on-state power loss of the device at any given current, the switching power loss becomes a dominating factor affecting the device junction temperature at high operating frequencies. Because of this, the maximum switching frequencies possible using conventional thyristors are limited in comparison with many other power devices.

Two of the most critical parameters for a thyristor are the built-in potential (which is a characteristic of any given semiconductor material's bandgap) and the specific on-resistance (i.e., the resistance of the device in the linear region when the device is turned on). The specific on-resistance for a thyristor preferably should be as small as possible so as to maximize current per unit area for a given voltage applied to the thyristor. The lower the specific on-resistance, the lower the $V_F$ drop is for a given current rating. The minimum $V_F$ for a given semiconductor material is its built-in potential (voltage).

Conventional thyristors are manufactured in silicon (Si) or gallium arsenide (GaAs), such as a silicon controlled rectifier ("SCR"). Thyristors formed in Si or GaAs, however, have certain performance limitations inherent in the Si or GaAs material itself, such as the thickness of the drift region. The largest contributory factor to specific on-resistance is the resistance of the thick low-doped drift region of the thyristor. As the rated voltage of a thyristor increases, typically the thickness of the drift region increases and the doping of the drift region decreases. Therefore, the resistance of the drift region increases dramatically. Hence, the thickness of the drift region should be minimized, and the level of doping maximized, for any given rated voltage so as to minimize the specific on-resistance for the device.

The problems with on-resistance have been recognized and several thyristor structures have been developed in an attempt to solve the on-resistance problems. These prior attempts to solve the problem included various structures of the Si or GaAs semiconductor material to try to lower the on-resistance. These prior attempts, however, were limited by the inherent characteristics of the Si or GaAs semiconductor material itself. For example, the doping level required to withstand a given voltage in a Si or GaAs thyristor is relatively low as compared to that required of a higher breakdown electric field material such as SiC. As a result, in order to form higher power thyristors in silicon or gallium arsenide, the doping in the appropriate portions of the device must be maintained at relatively low levels. This, in turn, requires that these portions be physically thicker, which makes for a generally disadvantageous specific resistance.

As a semiconductor material, silicon carbide offers a number of advantageously unique physical and electronic properties. These include its high melting point, high thermal conductivity, radiation hardness (particularly to neutron radiation), wide bandgap, high breakdown electric field, and high saturated electron drift velocity.

Recently, the common assignee of the present invention has developed various techniques for fabricating semiconductor devices from SiC, a wide bandgap material, which were previously unknown. Silicon carbide is a less mature semiconductor material than Si or GaAs because of its recent development and the performance of semiconductor devices manufactured with less mature material is generally less predictable. The common assignee of the present invention has recently developed several semiconductor devices, such as P-N Junction Diodes, Power MOSFET's, JFET's, blue light emitting diodes, thereby making SiC a commercially viable alternative to devices made from Si, GaAs, and other semiconductor materials.

Therefore, it is an object of the present invention to provide an operable thyristor formed in silicon carbide and that takes favorable advantage of the electronic characteristics of silicon carbide.

SUMMARY OF THE INVENTION

The present invention is a SiC thyristor capable of handling higher voltages operable over a wide temperature range, and having a low on-resistance. Because of SiC's physical and electronic characteristics, a thyristor formed in SiC provides improvement in on-resistance and high temperature performance over conventional thyristors formed in Si or GaAs. The low specific on-resistance, in turn, increases the switching frequency capabilities of the thyristor at high temperatures and high voltages.

Because of the higher doping levels allowed for a given voltage in SiC, the SiC thyristor can have a thinner drift layer and a much lower on-resistance than Si or GaAs thyristors of equivalent size, or much smaller thyristors for the same on-resistance. The high electric breakdown field, the high saturated electron drift velocity, and the high thermal conductivity offer further physical and electronic advantages in SiC thyristors. The ability to operate at high power levels and high temperatures, for example, greatly reduces the weight of space-based electronic cooling systems required for semiconductor devices, and silicon carbide's radiation hardness enhances its attractiveness for military and defense applications.

More particularly, the SiC thyristor of the present invention has a substrate, an anode, a drift region, a gate, and a cathode. The substrate, the anode, the drift region, the gate, and the cathode are each preferably formed of silicon carbide having a polytype selected from the group consisting of 3C, 2H, 4H, 6H, and 15R. The substrate is formed of silicon carbide having one conductivity type and the anode or the cathode, depending on the embodiment, is formed adjacent the substrate and has the same conductivity type as the substrate. A drift region of silicon carbide is formed adjacent the anode or cathode and has an opposite conductivity type as the anode or cathode. A gate is formed adjacent the drift region or the cathode, also depending on the embodiment, and has an opposite conductivity type as the drift region or the cathode. An anode or cathode, again depending on the embodiment, is formed adjacent the gate or drift region and has an opposite conductivity type than the gate.

A trench is preferably etched through the cathode or anode layer, depending on the embodiment, to the gate layer for forming a gate contact with the gate layer. Ohmic contacts, preferably aluminum, aluminum-titanium alloy, platinum, platinum silicide, or nickel, are made with the anode and cathode for forming respective anode and cathode contacts. In a first embodiment, the gate contact and the cathode contact are formed on common facing surfaces for applying current to the gate and the cathode to thereby turn on the thyristor. The gate contact and the cathode contact in a second embodiment are formed on opposite facing surfaces for applying current to the gate and the cathode to thereby turn on the thyristor.

These various embodiments, and methods of forming the same, provide SiC thyristors having low specific on-resistance at high temperature ranges. The improved performance characteristics of the SiC thyristor provide increased switching frequency capabilities of the thyristor at significantly higher temperatures and power levels than those in Si or GaAs.

DESCRIPTION OF THE DRAWINGS

Some of the features and advantages of the present invention having been stated, others will become apparent as the description proceeds when taken in conjunction with the accompanying drawings, in which.

DETAILED DESCRIPTION OF ILLUSTRATED EMBODIMENTS

The present invention now will be described more fully hereinafter with reference to the accompanying drawings in which illustrated embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
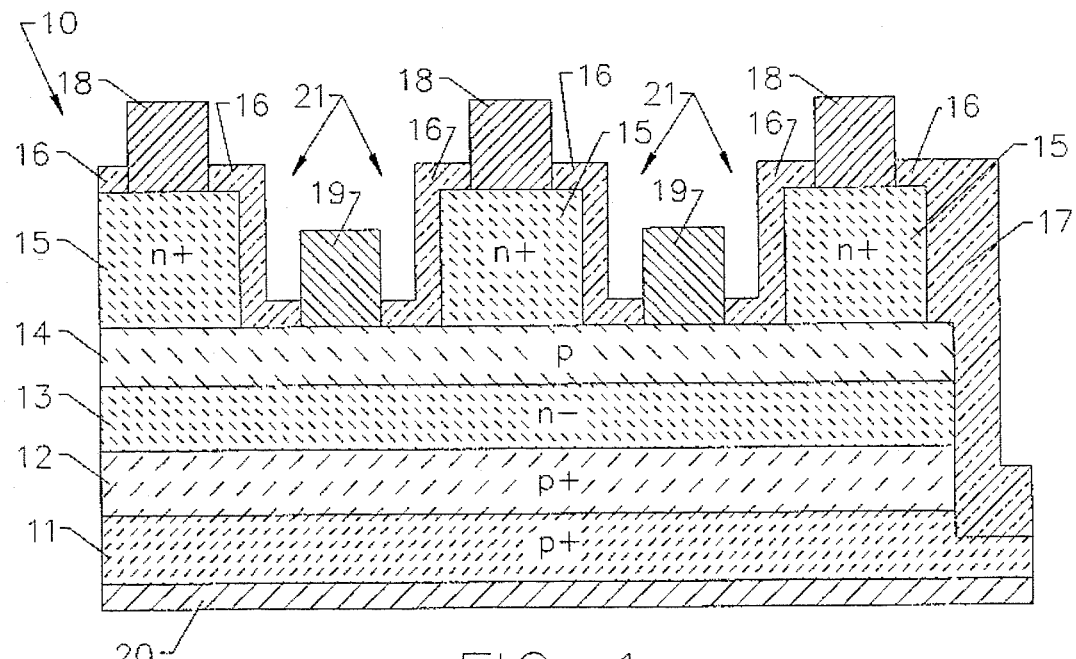
FIG. 1 is a schematic partial cross-sectional view of a p-n-p-n thyristor formed in silicon carbide according to a first embodiment of the present invention.
Figure 3:
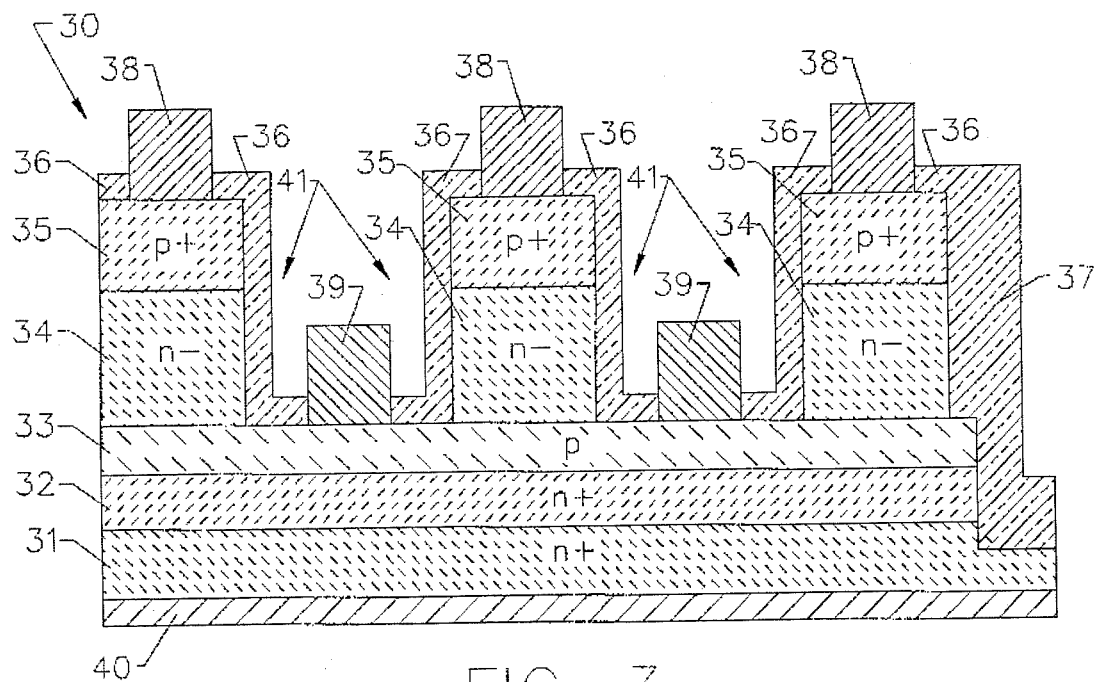
FIG. 3 is a schematic partial cross-sectional view of an p-n-p-n silicon carbide thyristor according to a second embodiment of the present invention.
Figure 4:
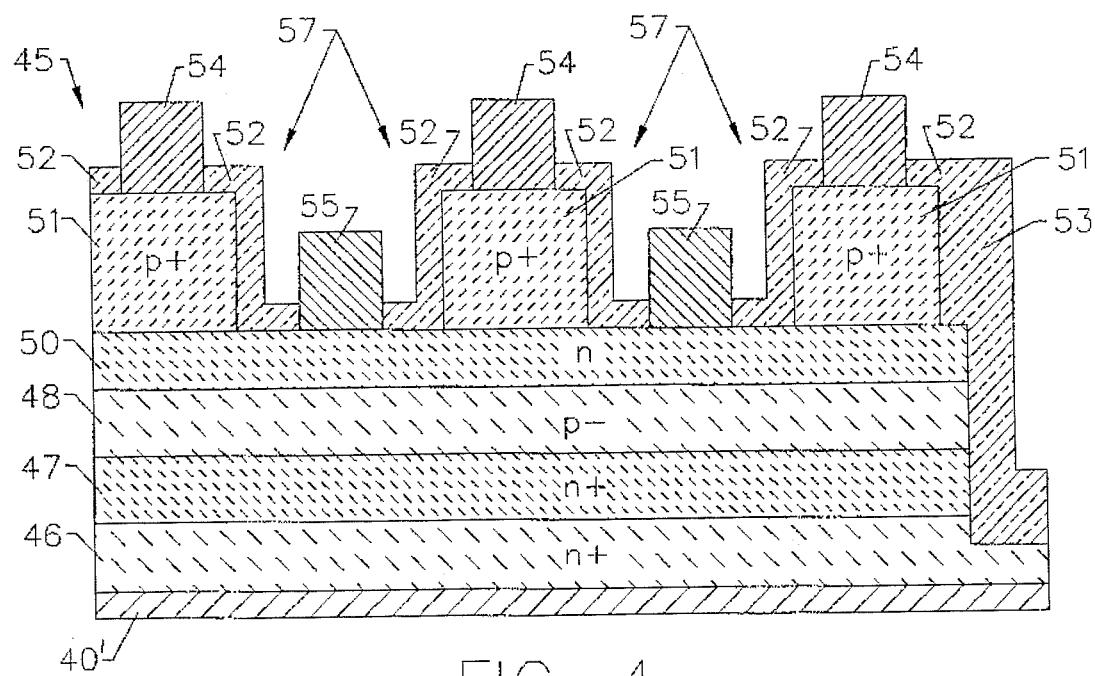
FIG. 4 is a schematic partial cross-sectional view of a n-p-n-p silicon carbide thyristor according to a third embodiment of the present invention.

Referring now to the drawings, FIGS. 1, 3, and 4 are three schematic partial cross-sectional views of three respective embodiments of the SiC thyristor according to the present invention. The SiC thyristor of the present invention has a substrate, an anode, a drift region, a gate, and a cathode. The substrate, the anode, the drift region, the gate, and the cathode are each preferably formed of SiC having a polytype selected from the group consisting of 3C, 2H, 4H, 6H, and 15R. In the illustrated embodiments, the n+ and n− regions, as well as the p+ and p−, are designated "+" and "−" to symbolize different doping levels respectively of the same material in a manner well understood to those of ordinary skill in this art. The p-type silicon carbide is preferably doped with aluminum or boron and the n-type silicon carbide is preferably doped with nitrogen or phosphorous.

In FIGS. 1, 3, and 4, the substrates are all illustrated as having an additional layer thereon of the same conductivity type; e.g., 11 and 12 in FIG. 1, 31 and 32 in FIG. 3, and 46 and 47 in FIG. 4. These additional layers are often added to a substrate in order to gain a region with a somewhat higher doping level. Generally speaking, such higher doping levels are easier to produce in epitaxial layers than in substrates taken from bulk crystals. It will be understood, however, that in each of the illustrated and claimed embodiments, a single layer which can of course be the substrate, if satisfactorily doped, is all that is required.

In the illustrated embodiments, the substrate is formed of SiC having one conductivity type and the anode or the cathode, depending on the embodiment, is formed adjacent the substrate and has the same conductivity type as the substrate. In the embodiments illustrated in FIGS. 1 and 4, a drift region of silicon carbide is formed adjacent the anode or cathode and has the opposite conductivity type from the anode or cathode. In FIG. 3, a gate is formed between the drift region and the cathode (which can be the substrate) and has the opposite conductivity type from the drift region and the cathode. An anode or cathode, again depending on the embodiment, is formed adjacent the gate or drift region and has the opposite conductivity type from the gate. These embodiments illustrate the thyristor as a generally vertical four-layer structure, but other structures such as a horizontal configuration may also be used as understood by those skilled in the art.

These various embodiments disclosed herein, and methods of forming the same, provide a SiC thyristor having a low specific on-resistance over wide temperature ranges, including high temperatures at which Si-based devices would thermally fail ("thermal runaway"), or degrade. The improved performance characteristics of the SiC thyristor provide increased switching frequency capabilities of the thyristor at significantly higher temperatures and power levels than those in Si or GaAs. The high electric breakdown field, the high saturated electron drift velocity, and the high thermal conductivity of SiC give the device the advantages referred to above. The ability to operate at high power levels and high temperatures, for example, greatly reduces the weight of space-based electronic cooling systems required for semiconductor devices such as the thyristor according to the present invention.

More particularly, FIG. 1 illustrates a schematic partial cross-sectional view of a first embodiment of the SiC thyristor 10 according to the present invention. A first region 11 of p-type silicon defines a substrate and a second region 12 of silicon carbide adjacent the first region 11 and also having p-type conductivity defines an anode of the thyristor 10. A third region 13 of n-type silicon carbide adjacent the second region 12 defines a drift region. A fourth region 14 of p-type silicon carbide adjacent the third region 13 defines a gate of the thyristor 10 and a fifth region 15 of n-type silicon carbide adjacent the fourth region 14 defines a cathode of the thyristor.

In the embodiment illustrated in FIG. 1, the thyristor 10 has a p-n-p-n four-layer structure, thereby forming three p-n junctions, on a $p^+$ type silicon carbide substrate 11. It will be understood that FIGS. 1, 3, and 4 are schematic, rather than scale diagrams. In the SiC thyristor according to the first embodiment, the four-layer structure is preferably epitaxially grown on a $p^+$ 6H-SiC substrate 11. The first epilayer grown is a $p^+$ 6H-SiC layer 12 and forms the anode of the thyristor 10. This anode layer 12 is then followed by an $n^-$ 6H-SiC drift epilayer 13, which sustains the high reverse and forward voltage of the thyristor. A thin p-type 6H-SiC epilayer 14 is then grown for forming the gate layer. The gate layer 14 is followed by a slightly thicker $n^+$ epilayer 15 for forming the cathode or emitter region. The cathode 15 is heavily doped n-type material, and the thicker cathode 15 is used to reduce or eliminate the effects of bandgap narrowing.

In an early example of a thyristor according to the present invention, the substrate 11 had a resistivity of 0.1–0.2 Ω-cm, and the first epilayer 12 had a carrier density of about $8 \times 10^{17}$ $cm^{-3}$ and a thickness of about 0.4 μm. The drift layer 13 had a doping level of about $1.5 \times 10^{17}$ $cm^{-3}$ and was approximately 3.0 μm thick. It will be understood by those familiar with thyristors and semiconductor materials, however, that the doping and thickness of the drift layer are selected purely as a function of the voltage desired or selected. In the present example, the thyristor was a 100 V device. Further to this example, the gate layer 14 was about 0.6 μm thick and doped at about $1.5 \times 10^{17}$ $cm^{-3}$. The cathode layer 15 was more heavily doped at about $10^{19}$ $cm^{-3}$ and was about 1–2 μm thick.

It will be further understood by those familiar with thyristor structures that one or more of the doped portions could be formed by ion implantation. U.S. Pat. No. 5,087,576, for which the present assignee is the exclusive licensee, provides appropriate techniques for ion implantation into SiC, and is incorporated entirely herein by reference.

A trench 21 is etched through the $n^+$ cathode layer 15 to the $p^-$ type gate layer 14. The thyristor 10 is fabricated using a mesa geometry as illustrated. The junctions are passivated with thermally grown $SiO_2$ 16 by methods such as disclosed by the commonly assigned patent application Ser. No. 07/893,642 filed Jun. 5, 1992 for "Method for Obtaining High Quality $SiO_2$ Passivation on Silicon Carbide Structures," and which is incorporated entirely herein by reference. The trench 21 is formed by reactive ion etching ("RIE") openings into the four-layer p-n-p-n structure down to the $p^-$ type gate layer 14. The etching can be carried out as set forth in U.S. Pat. Nos. 4,865,685 and 4,981,551, both of which are also incorporated entirely herein by reference. Electrical conduction between devices is checked at intervals during RIE in nitrogen trifluoride ($NF_3$) of the cathode layer 15. The gate layer 14 has been reached when back-to-back p-n or n-p junctions are detected thereby forming the trench 21 of the thyristor 10. The outer sidewall mesa 17 is then reactive ion etched down to the $p^+$ substrate 11 in order to provide mesa termination for the periphery of the device. Such termination confines the depletion region spread of the device when a voltage is applied to the thyristor. The wafer is oxidized ($SiO_2$) to grow the sidewall passivation layer on the exposed surfaces of the thyristor as illustrated.

A gate contact 19 to the $p^-$ type gate layer 14 is deposited and patterned within the trench 21 after windows are opened in the oxide layer 16. Windows are then opened in the insulating or oxide layer 16 on top of the $n^+$ cathode mesa layers 15 where an electrode, i.e., ohmic contact, is formed for the $n^+$ cathode layer 15 by depositing a metal material such as sintered nickel (Ni) for forming a cathode contact 18. An electrode, i.e., ohmic contact, is also formed for the substrate 11 with a metal material such as sintered aluminum (Al) for forming an anode contact 20. The contacts 18, 19, 2,) are annealed and gold overlays are deposited and patterned for use in wirebonding.

As illustrated by FIG. 1, the gate and cathode contacts (19 and 18 respectively) are on commonly facing surfaces of the thyristor 10, and the anode contact 20 is on an opposite facing surface.

In operation, the thyristor 10 is turned on by applying a short current pulse across the gate contact 19 (or base region) and the cathode contact 18 (or emitter region). This current pulse forward biases the anode-drift and drift-gate p-n junctions and causes electrons to diffuse across to the gate region 14. Once the thyristor 10 turns on, the gate 14 loses its control to turn off the thyristor 10. The turn off is achieved by applying a reverse voltage across the anode 12 and the cathode 15. The drift layer 13 sustains the high reverse and forward voltage of the thyristor 10 to thereby control the voltage of the thyristor, i.e., switching or passing voltages.

Figure 2A:
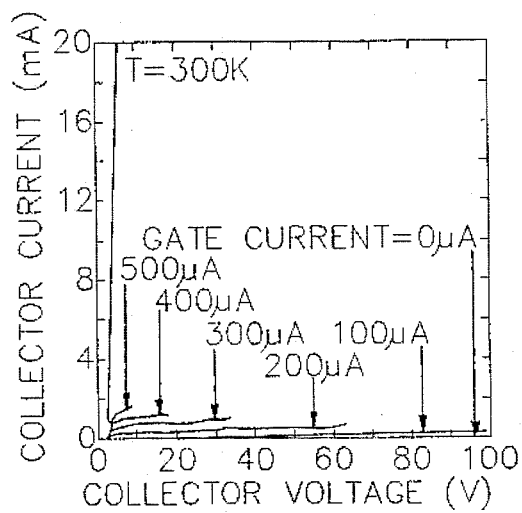
FIG. 2A is a graphical plot of collector voltage versus collector current at a temperature of 300° Kelvin according to a silicon carbide thyristor embodiment of FIG. 1.
Figure 2B:
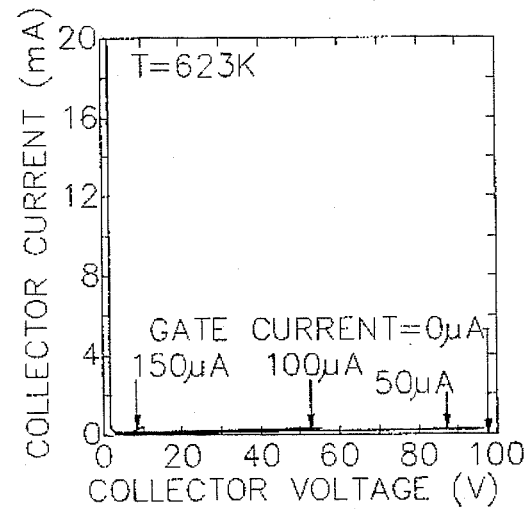
FIG. 2B is a graphical plot of collector voltage versus collector current at 623° Kelvin according to a silicon carbide thyristor embodiment of FIG. 1.

FIG. 2A is a graphical plot of collector voltage versus collector current at a temperature of 27° Celsius (C) (300° Kelvin (K)) according to a SiC thyristor 10 embodiment of FIG. 1. FIG. 2B is a graphical plot of collector voltage versus collector current 350° C. (623° K.) according to a SiC thyristor 10 embodiment of FIG. 1. As these plots illustrate, the thyristors have forward and reverse breakover voltages of 100 volts (V) with no gate current ($I_g=0$). The 100 V limit was due to punch-through in the gate layer 14 rather than avalanche breakdown. At room temperature, the forward breakover voltage may be reduced to 8 V with a trigger current of 500 microamps (μA). These values were produced in early examples of the invention, and even better performance is expected for additional devices.

The specific on-resistance of these devices was 126 mΩ-$cm^2$ at room temperature as shown by FIG. 2A. As the temperature was raised, more efficient ionization of the aluminum (Al) dopant in the p-type substrate may be achieved and both the required trigger current and the on-resistance reduce dramatically. At 350° C. (as shown by FIG. 2B), these devices have even better operation, with a trigger current of 150 μA for an 8 V breakover and a specific on-resistance of 11 mΩ-$cm^2$. The forward and reverse breakover voltage with $I_g=0$ was still higher than 100 V. The lower resistance at the higher temperature shows that devices with p-type substrates work very well at high temperatures, and those with n-type substrates are expected to perform much better at room temperature and at high temperature in light of the normally higher conductivity of n-type material.

Figure 5:
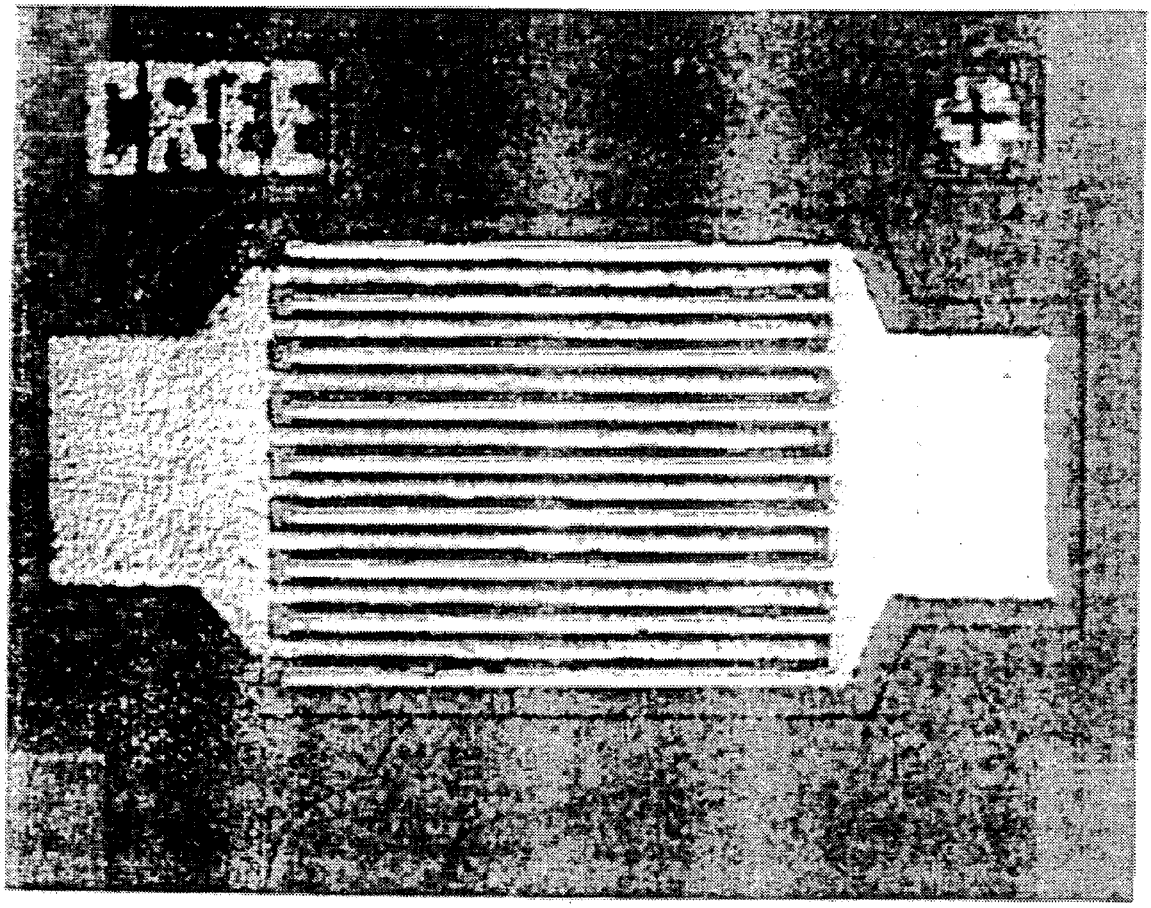
FIG. 5 is a photographic view of a mask, at 200 times magnification, used to form a silicon carbide thyristor according to the first embodiment of the present invention.

FIG. 5 is a photographic view of a mask having an active area of $6.7 \times 10^{-4}$ cm$^{-2}$ (total area $1.05 \times 10^{-3}$ cm$^{-2}$), at 200 times magnification, used to form a silicon carbide thyristor 10 according to the first illustrated embodiment as described with reference to FIGS. 1, 2A, and 2B. Although the mask was particularly used to form the SiC thyristor according to the first embodiment, it will be apparent to those skilled in the art that other masks and configurations of the thyristor according to the present invention are also understood.

FIG. 3 illustrates a schematic partial cross-sectional view of a second embodiment of a SiC thyristor 30 according to the present invention. Essentially, the device of FIG. 3 has its structure inverted with respect to FIG. 1 in order to incorporate n-type SiC as the physical substrate of the thyristor. A first region 31 of n-type silicon carbide defines a substrate and a second region 32 of silicon carbide adjacent the first region and also having n-type conductivity defines a cathode of the thyristor 30. A third region 33 of p-type silicon carbide adjacent the second region defines a gate of the thyristor 30. A fourth region 34 of n-type silicon carbide adjacent the third region 33 defines a drift region. A fifth region 35 of p-type silicon carbide adjacent the fourth region defines an anode of the thyristor 30.

The embodiment of a SiC thyristor 30 shown in FIG. 3, preferably has an p-n-p-n four-layer structure, or three p-n or n-p junctions, on an n-type SiC substrate. In order to form the SiC thyristor 30 of the second embodiment, an n$^+$ SiC layer 32 is epitaxially grown for forming the cathode or emitter region of the thyristor 30 on an n$^+$ SiC substrate Since the substrate 31 has the same conductivity type as the cathode 32, the effects of bandgap narrowing will be reduced and effectively eliminated. A thin p-type SiC epilayer 33 is then grown on the cathode 32 for forming a gate layer. This gate layer 33 is then followed by a thicker n$^-$ 6H-SiC drift epilayer 34 having a selected carrier density and thickness chosen to sustain a selected reverse and forward voltage of the thyristor 30. A heavily doped p$^+$ SiC epilayer 35 is then grown on the drift layer 34 for forming the anode.

In another sample thyristor having the structure illustrated in FIG. 3, and designed for 200 Volt capacity, the cathode layer 32 has a carrier density of about $10^{19}$ cm$^{-3}$ and a thickness of about 0.4 μm. The substrate 31 has a resistivity in the range of about 0.02–0.04 Ω-cm. The gate layer 33 has a carrier density of about $10^{18}$ cm$^{-3}$ and a thickness of about 0.5–0.6 μm. The drift layer 34 is somewhat thicker, about 2 μm, and has a carrier concentration of about $1.5 \times 10^{17}$ cm$^{-3}$. The anode layer 35 has a carrier density of about $10^{19}$ cm$^{-3}$ and a thickness of about 0.8 μm.

A deeper trench 41 than trench 21 of the first embodiment is formed by reactive ion etching ("RIE") through the p$^+$ anode layer 35 n$^-$ and drift layer 34 to the p-type gate layer 33 for establishing a gate contact 39 with the p-type gate layer 33. The gate layer 33 may be determined to have been reached during the etching process by electrically measuring from the backside of the wafer to the etched layer so as to detect a p-n junction. Ohmic contacts are then made with the n$^+$ substrate 31 with sintered Ni for forming a cathode contact 41 and with the anode p$^+$ layer 35 with sintered aluminum, aluminum-titanium alloy, platinum, or platinum-silicide for forming an anode contact 38 in a similar method as that described with reference to FIG. 1. The operation of the thyristor 30 is also similar to the operation as described with reference to FIG. 1 and the respective cathode, gate, drift, and anode layers.

FIG. 4 illustrates a schematic partial cross-sectional view of a third embodiment of the SiC thyristor 45 according to the present invention. This embodiment has the same structure as FIG. 1, but with respective opposite conductivity type materials. The resulting structure has a physical substrate formed of n-type SiC as is generally most preferred. This SiC thyristor embodiment has an n-p-n-p four-layer structure with three p-n or n-p junctions. A first region 46 of n-type silicon carbide defines a substrate and a second region 47 of n-type silicon carbide adjacent the first region defines a cathode of the thyristor. A third region 48 of p-type silicon carbide adjacent the second region defines a drift region. A fourth region 50 of n-type silicon carbide adjacent the third region 48 defines a gate of the thyristor 45 and a fifth region 51 of p-type silicon carbide adjacent the fourth region 50 defines an anode of the thyristor 45.

The third embodiment also preferably has an n-p-n-p four-layer structure on an n-type SiC substrate 46. In order to form the SiC thyristor 45 of the third embodiment, an n$^+$ SiC layer 47 is epitaxially grown on an n$^+$ SiC substrate 46 for forming the cathode of the thyristor 45. A p$^-$ SiC epilayer 48 is then grown on the cathode for forming a drift region, which sustains the high reverse and forward voltage of the thyristor 45. This drift layer 48 is then followed by a n-type 6H-SiC gate epilayer 50. A p$^+$ SiC epilayer 51 is then grown on the gate layer for forming the anode.

A trench 57 is formed by reactive ion etching down through the anode layer 51 to the gate layer 50 for establishing a gate contact 55 with the n-type gate layer 50 as described above with reference to FIG. 1. Ohmic contacts are also made with the n$^+$ substrate 46 for forming a cathode contact 56 and with the p$^+$ anode layer 51 for forming an anode contact 54. The operation of the thyristor 45 is also similar to the operation as described with reference to FIG. 1 and the respective cathode, drift, gate, and anode layers.

These thyristors 10, 30, 45 of the first, second, and third embodiments have an interdigitated configuration, as illustrated in FIG. 5, which minimizes the effect of sheet resistance in the thin gate regions. The cathode is the emitter region, but in the first embodiment the cathode is a front side contact and in the second embodiment the cathode is a backside contact. In the third embodiment, the top mesa portion is the anode. The interdigitated configurations use eight fingers (emitter region for FIG. 1 and collector for FIGS. 2 and 3) with nine gate fingers surrounding them. For the structure of FIG. 1, the cathode contact is made to the top n$^+$ layer. The eight fingers are about 5 μm wide and 250 μm long with an area of about $3.8 \times 10^{-4}$ cm$^2$, and the nine gate fingers are about 10 μm wide and 265 μm long. The gate contact to cathode mesa distance is about 2.5 μm. The anode region is isolated by etching a mesa around the entire device down to the substrate with an area of about $1.05 \times 10^{-3}$ cm$^2$.

Although RIE may be used for each of the respective embodiments of FIGS. 1, 3, and 4, other etching processes such as conduction-type selective etching, i.e., photoelectrochemical etching, may also be used for etching patterns in SiC and for providing conductivity selective etching stops (i.e., selective etching of n-type material which stops at an underlying p$^-$ layer or vice versa). For this process, ohmic contact is made to the SiC. The SiC is then patterned leaving only the portions desired to be etched exposed. Either polyamide or black wax may be used as patterning materials. A photoresist may also be used for this purpose. The wafer is then placed in a Teflon cell, along with a platinum (Pt)

counterelectrode and a saturated calomel reference electrode. The cell potential is controlled with a potentiostat. The electrolyte may be a HF:H$_2$O:H$_2$O$_2$ solution. Etching of n-type material occurs when the SiC is exposed to ultraviolet (UV) radiation. The light source may be a frequency doubled Ar+ laser at 257 nanometers (nm) focused to a 2–3 µm spot and rastered across the wafer.

In the drawings and specification, there has been disclosed illustrated embodiments of the invention and, although specific terms are employed, they are used in a generic and descriptive sense only and not for the purposes of limitation, the scope of the invention being set forth in the following claims.

That which is claimed is:

1. A thyristor capable of operating over a wide temperature range, said thyristor comprising:

a substrate formed of silicon carbide an anode formed of silicon carbide and positioned to overlie said substrate;

a gate positioned to overlie said anode;

a drift region formed of silicon carbide and positioned between said anode and said gate having a thickness less than a comparable silicon thyristor and a doping level higher than a comparable silicon thyristor at a predetermined operating voltage for providing a thyristor having a wide temperature range;

a cathode formed of silicon carbide and positioned to overlie said gate; and ohmic contacts positioned on at least said gate and said cathode.

2. A thyristor according to claim 1, wherein said anode, gate, and cathode are each formed of silicon carbide having a polytype selected from the group consisting of 3C, 2H, 4H, 6H, and 15R.

3. A thyristor according to claim 1, wherein said ohmic contacts are selected from the group consisting of alumminum, aluminum-titanium alloys, platinum, platinum silicide, and nickel.

4. A thyristor according to claim 1, further comprising an insulating layer positioned adjacent said gate and cathode for passivating a surface between said gate contact and said cathode contact.

5. A thyristor according to claim 4, wherein said insulating layer comprises silicon dioxide.

6. A thyristor having a low on-resistance and capable of operating over a wide temperature range, said thyristor comprising:

a substrate formed of silicon carbide;

a cathode formed of silicon carbide and positioned to overlie said substrate;

a drift region positioned to overlie said cathode and formed of silicon carbide, said drift region having a thickness less than a comparable silicon thyristor and a doping level higher than a comparable silicon thyristor at a predetermined operating voltage for providing a thyristor having a wide temperature range;

a gate positioned to overlie said drift region and formed of silicon carbide;

an anode positioned to overlie said gate and formed of silicon carbide, and ohmic contacts positioned on at least said gate and said anode.

7. A thyristor according to claim 6, wherein said contacts are selected from the group consisting of aluminum, aluminum-titanium alloys, platinum, platinum silicide, and nickel.

8. A thyristor according to claim 6 and further comprising a passivation layer on exposed surfaces of said thyristor.

9. A thyristor according to claim 8 wherein said passivation layer comprises silicon dioxide.

10. A thyristor having a low on-resistance and capable of operating over a wide temperature range, said thyristor comprising:

a substrate formed of silicon carbide;

a cathode positioned to overlie said substrate and formed of silicon carbide;

a gate positioned to overlie said substrate and formed of silicon carbide;

a drift region positioned to overlie said gate and formed of silicon carbide, said drift region having a thickness less than a comparable silicon thyristor and a doping level higher than a comparable silicon thyristor at a predetermined operating voltage for providing a thyristor having a wide temperature range;

an anode positioned to overlie said substrate and formed of silicon carbide; and ohmic contacts connected to said gate, said cathode, and said anode.

11. A thyristor according to claim 10, wherein said contacts are selected from the group consisting of aluminum, aluminum-titanium alloys, platinum, platinum silicide, and nickel.

12. A thyristor according to claim 10 and further comprising a passivation layer on exposed surfaces of said thyristor.

13. A thyristor according to claim 12 wherein said passivation layer comprises silicon dioxide.

14. A thyristor according to claim 10 wherein said anode further comprises p-type silicon carbide.

15. A thyristor according to claim 10, further comprising mesa terminated peripheral edges for confining the depletion region of said thryistor when a voltage is applied to said thyristor.

16. A thyristor according to claim 10 wherein said cathode further comprises n-type silicon carbide.

17. A thyristor according to claim 10, further comprising a trench formed in said anode, and said drift region for forming a gate contact to said gate.

18. A thyristor according to claim 15 and further comprising a passivation layer on exposed surfaces of said thyristor.

* * * * *

UNITED STATES PATENT AND TRADEMARK OFFICE
CERTIFICATE OF CORRECTION

PATENT NO.  : 5,539,217
DATED       : July 23, 1996
INVENTOR(S) : Edmond et al.

It is certified that error appears in the above-identified patent and that said Letters Patent is hereby corrected as shown below:

[56] References Cited

Line 12, "Boliga" should be --Baliga--.

Line 33, "Dymistor" should be --Dynistor--.

Line 41, "proportions" should be --Properties--.

Column 1, line 9, "00014-90-C-0037," should be --N00014-90-C-0037,--.

Column 6, line 23, "2,)" should be --20--.

Column 7, line 33, after "substrate" insert --31.--.

Signed and Sealed this

Twenty-fifth Day of March, 1997

*Attest:*

BRUCE LEHMAN

*Attesting Officer*     Commissioner of Patents and Trademarks